(12) United States Patent
Kabbani et al.

(10) Patent No.: US 11,549,981 B2
(45) Date of Patent: Jan. 10, 2023

(54) THERMAL SOLUTION FOR MASSIVELY PARALLEL TESTING

(71) Applicant: Advantest Test Solutions, Inc., San Jose, CA (US)

(72) Inventors: Samer Kabbani, San Jose, CA (US); Kazuyuki Yamashita, San Jose, CA (US); Hiroki Ikeda, San Jose, CA (US); Ira Leventhal, San Jose, CA (US); Mohammad Ghazvini, San Jose, CA (US); Paul Ferrari, San Jose, CA (US); Karthik Ranganathan, San Jose, CA (US); Gregory Cruzan, San Jose, CA (US); Gilberto Oseguera, San Jose, CA (US)

(73) Assignee: Advantest Test Solutions, Inc., San Jose, CA (US)

(*) Notice: Subject to any disclaimer, the term of this patent is extended or adjusted under 35 U.S.C. 154(b) by 0 days.

(21) Appl. No.: 17/479,998

(22) Filed: Sep. 20, 2021

(65) Prior Publication Data
US 2022/0107360 A1 Apr. 7, 2022

Related U.S. Application Data

(60) Provisional application No. 63/086,522, filed on Oct. 1, 2020.

(51) Int. Cl.
*G01R 31/28* (2006.01)

(52) U.S. Cl.
CPC ..... *G01R 31/2891* (2013.01); *G01R 31/2875* (2013.01); *G01R 31/2877* (2013.01); *G01R 31/2889* (2013.01)

(58) Field of Classification Search
CPC .......................... G01R 1/0458; G01R 31/2884
See application file for complete search history.

(56) References Cited

U.S. PATENT DOCUMENTS 5,126,656 A 6/1992 Jones
5,164,661 A 11/1992 Jones
(Continued)

FOREIGN PATENT DOCUMENTS

CN 101073016 A 11/2007
CN 103038751 A 4/2013
(Continued)

OTHER PUBLICATIONS

Ranganathan et al. D517: Shielded Socket and Carrier for High-Volume Test of Semiconductor Devices; Powerpoint; 12 pp. Sep. 30, 2021.

*Primary Examiner* — Tung X Nguyen

(57) ABSTRACT

An apparatus for thermal control of a device under test (DUT) includes a cooling structure operable to provide cooling, the cooling structure operable to inlet cooling material via an inlet port thereof and operable to outlet cooling material via an outlet port thereof, a variable thermal conductance material (VTCM) layer disposed on a surface of the cooling structure, and a heater layer operable to generate heat based on an electronic control, and wherein the VTCM layer is operable to transfer cooling from the cooling structure to the heater layer. A thermal interface material layer is disposed on the heater layer. The thermal interface material layer is operable to provide thermal coupling and mechanical compliance with respect to the DUT. The apparatus includes a compression mechanism for providing compression to the VTCM layer to vary a thermal conductance of the VTCM layer. The compression mechanism is also for decoupling the VTCM layer from the heater layer.

20 Claims, 11 Drawing Sheets

(56) References Cited

U.S. PATENT DOCUMENTS

| | | |
|---|---|---|
| 5,239,093 A | 8/1993 | Cheng |
| 5,315,240 A | 5/1994 | Jones |
| 5,329,093 A | 7/1994 | Okano |
| 5,420,521 A | 5/1995 | Jones |
| 5,821,505 A | 10/1998 | Tustaniwskyj et al. |
| 6,184,504 B1 | 2/2001 | Cardella |
| 6,359,264 B1 | 3/2002 | Schaper et al. |
| 6,389,225 B1 | 5/2002 | Malinoski et al. |
| 6,498,899 B2 | 12/2002 | Malinoski et al. |
| 6,515,470 B2 | 2/2003 | Suzuki et al. |
| 6,668,570 B2 | 12/2003 | Wall et al. |
| 6,711,904 B1 | 3/2004 | Law et al. |
| 6,825,681 B2 | 11/2004 | Feder et al. |
| 6,862,405 B2 | 3/2005 | Malinoski et al. |
| 6,985,000 B2 | 1/2006 | Feder et al. |
| 7,042,240 B2 | 5/2006 | Lopez et al. |
| 7,138,811 B1 | 11/2006 | Mahoney et al. |
| 7,151,388 B2 | 12/2006 | Gopal et al. |
| 7,311,782 B2 | 12/2007 | Strang et al. |
| 7,355,428 B2 | 4/2008 | Kabbani et al. |
| 7,411,792 B2 | 8/2008 | Richards et al. |
| 7,436,059 B1 | 10/2008 | Ouyang |
| 7,519,880 B1 | 4/2009 | Johnson et al. |
| 7,626,407 B2 | 12/2009 | Kabbani |
| 7,659,738 B2 | 2/2010 | Hong |
| 7,726,145 B2 | 6/2010 | Nakamura |
| 7,755,899 B2 | 7/2010 | Stenmark |
| 7,781,883 B2 | 8/2010 | Sri-Jayantha et al. |
| 7,830,164 B2 | 11/2010 | Earle et al. |
| 7,848,106 B2 | 12/2010 | Merrow |
| 8,343,280 B2 | 1/2013 | Iimuro |
| 8,558,540 B2 | 10/2013 | Wu et al. |
| 8,772,682 B2 | 7/2014 | Ambal et al. |
| 8,927,907 B2 | 1/2015 | Fink et al. |
| 8,970,244 B2 | 3/2015 | Di Stefano et al. |
| 9,080,820 B2 | 7/2015 | Bolton |
| 9,291,667 B2 | 3/2016 | Armstrong et al. |
| 9,307,578 B2 | 4/2016 | Pease |
| 9,310,145 B2 | 4/2016 | Colongo et al. |
| 9,414,526 B2 | 8/2016 | Mann et al. |
| 9,494,353 B2 | 11/2016 | Yu et al. |
| 9,594,113 B2 | 3/2017 | Davis et al. |
| 9,766,287 B2 | 9/2017 | Narasaki et al. |
| 9,841,772 B2 | 12/2017 | Bucher |
| 10,056,225 B2 | 8/2018 | Gaff et al. |
| 10,126,356 B2 | 11/2018 | Barabi et al. |
| 10,163,668 B2 | 12/2018 | Steinhauser |
| 10,354,785 B2 | 7/2019 | Yamaguchi et al. |
| 10,656,200 B2 | 5/2020 | Cruzan et al. |
| 10,775,408 B2 | 9/2020 | Carvalho et al. |
| 10,908,207 B2 | 2/2021 | Barabi et al. |
| 10,955,466 B2 | 3/2021 | Tsai et al. |
| 10,983,145 B2 | 4/2021 | Akers et al. |
| 11,143,697 B2 | 10/2021 | Wolff |
| 2002/0026258 A1 | 2/2002 | Suzuki et al. |
| 2002/0118032 A1 | 8/2002 | Norris et al. |
| 2003/0155939 A1 | 8/2003 | Lutz et al. |
| 2004/0017185 A1 | 1/2004 | Song et al. |
| 2005/0026476 A1 | 2/2005 | Mok et al. |
| 2005/0086948 A1 | 4/2005 | Milke-Rojo et al. |
| 2005/0103034 A1 | 5/2005 | Hamilton et al. |
| 2005/0151553 A1 | 7/2005 | Kabbani et al. |
| 2006/0158207 A1 | 7/2006 | Reitinger |
| 2006/0290370 A1 | 12/2006 | Lopez |
| 2009/0160472 A1 | 6/2009 | Segawa et al. |
| 2009/0218087 A1 | 9/2009 | Oshima |
| 2010/0042355 A1 | 2/2010 | Aube et al. |
| 2011/0050268 A1 | 3/2011 | Co et al. |
| 2011/0074080 A1 | 3/2011 | DiStefano et al. |
| 2013/0181576 A1 | 7/2013 | Shiozawa et al. |
| 2013/0285686 A1 | 10/2013 | Malik et al. |
| 2014/0035715 A1 | 2/2014 | Takahashi et al. |
| 2014/0251214 A1 | 9/2014 | Cuvalc et al. |
| 2015/0028912 A1 | 1/2015 | Cho et al. |
| 2015/0137842 A1 | 5/2015 | Murakami et al. |
| 2015/0226794 A1 | 8/2015 | Chen |
| 2016/0084880 A1 | 3/2016 | LoCicero et al. |
| 2016/0247552 A1 | 8/2016 | Kim et al. |
| 2016/0351526 A1 | 12/2016 | Boyd et al. |
| 2017/0102409 A1 | 4/2017 | Sarhad et al. |
| 2018/0024188 A1 | 1/2018 | Cruzan et al. |
| 2018/0189159 A1 | 7/2018 | Carmichael et al. |
| 2018/0218926 A1 | 8/2018 | Stuckey et al. |
| 2019/0064254 A1 | 2/2019 | Bowyer et al. |
| 2019/0162777 A1 | 5/2019 | Chiang et al. |
| 2019/0271719 A1 | 9/2019 | Sterzbach |
| 2019/0310314 A1 | 10/2019 | Liu et al. |
| 2019/0346482 A1 | 11/2019 | Kiyokawa et al. |
| 2020/0041564 A1* | 2/2020 | Cojocneanu ....... G01R 31/2868 |
| 2020/0363104 A1 | 11/2020 | MacDonald et al. |
| 2020/0371155 A1 | 11/2020 | Walczyk et al. |
| 2021/0071917 A1 | 3/2021 | Pei et al. |
| 2021/0183668 A1* | 6/2021 | Cagle ................. G01R 31/2891 |
| 2021/0293495 A1 | 9/2021 | Barako et al. |
| 2021/0396801 A1 | 12/2021 | Ranganathan et al. |
| 2022/0044084 A1 | 2/2022 | Cardy |
| 2022/0082587 A1 | 3/2022 | Gopal et al. |
| 2022/0137092 A1 | 5/2022 | Ranganathan et al. |
| 2022/0137129 A1 | 5/2022 | Ranganathan et al. |
| 2022/0206061 A1 | 6/2022 | Ranganathan et al. |

FOREIGN PATENT DOCUMENTS

| | | |
|---|---|---|
| CN | 105144114 A | 12/2015 |
| CN | 109716513 A | 5/2019 |
| CN | 110214270 A | 9/2019 |
| CN | 110618903 A | 12/2019 |
| EP | 3270261 A1 | 1/2018 |
| JP | 2005156172 A | 6/2005 |
| JP | 2008275512 A | 11/2008 |
| TW | 446682 B | 7/2001 |
| TW | 200535440 A | 11/2005 |
| TW | 200620596 A | 6/2006 |
| TW | 200628818 A | 8/2006 |
| TW | 201226579 A | 7/2012 |
| TW | 201229535 A | 7/2012 |
| TW | 201323883 A | 6/2013 |
| TW | 201504647 A | 7/2013 |
| TW | 201447325 A | 12/2014 |
| TW | 201636618 A | 12/2014 |
| TW | 201608254 A | 3/2016 |
| TW | 201636618 A | 10/2016 |
| TW | 201712459 A | 4/2017 |
| TW | 201834134 A | 9/2018 |
| TW | 201840996 A | 11/2018 |
| TW | 202004980 A | 1/2020 |
| TW | 202043787 A | 12/2020 |
| WO | 2016122039 A1 | 8/2016 |
| WO | 2017015052 A1 | 1/2017 |
| WO | 2017039936 A1 | 3/2017 |
| WO | 2017112076 A1 | 6/2017 |
| WO | 2020159954 A1 | 8/2020 |

* cited by examiner

THERMAL SOLUTION FOR MASSIVELY PARALLEL TESTING

RELATED APPLICATION

This application claims benefit of U.S. Provisional Application Ser. No. 63/086,522, filed Oct. 11, 2020, entitled "Thermal Solution for Massively Parallel Testing," which is incorporated herein by reference in its entirety.

FIELD OF INVENTION

Embodiments of the present invention relate to the field of integrated circuit manufacturing and test. More specifically, embodiments of the present invention relate to systems and methods for thermal control for device under test (DUT) testing.

BACKGROUND

It is common to subject integrated circuits, either packaged or unpackaged, to environmental testing as an operation in a development and/or manufacturing process. Typically in such testing, the integrated circuit devices are subject to electrical testing, e.g. "test patterns," or "vectors," to confirm functionality while being subjected to environmental stress. For example, an integrated circuit is heated and/or cooled to its specification limits while being electrically tested. In some cases, for qualification testing, an integrated circuit may be stressed beyond its specifications, for example, to determine failure points and/or to establish "guard band" information regarding its environmental specifications.

Traditionally, such testing has included placing one or more integrated circuits and their associated test: interface(s) and, support hardware into an environmental chamber. The environmental chamber would heat and/or cool the integrated circuit(s) under test, known as or referred to, as a device under test, or "DUT," as well as the test interface and support hardware, to the desired test temperature. Unfortunately, use of such test chambers has numerous drawbacks. For example, the limits and/or accuracy of such testing may be degraded due to environmental limits of the test interface circuits and/or devices. In addition, due to the large volumes of air and mass of mounting structures and interface devices required within an environmental test chamber, the environmental inside such a test chamber may not be changed rapidly, limiting a rate of testing. Further, placing and removing DUTs and testing apparatus into and out of such test chambers further limits rates of testing, and requires complex and expensive mechanisms to perform such insertions and removals.

Recently, environmental test systems have been created that heat and/or cool a DUT directly, without placing the DUT and test apparatus into an environmental chamber, Such "chamber-less" test systems overcome many of the limitations of chamber-based testing. Unfortunately, chamberless test systems introduce testing difficulties, particularly related to cooling integrated circuits under test.

Cooling of integrated circuits under test is typically performed by thermally coupling a cooling structure, e.g., metal, to the device under test, A cooling fluid, e.g., comprising glycol, is circulated through a portion of the cooling structure. To adjust the temperature of the cooling structure, the temperature of the cooling fluid may be adjusted. The flow of the cooling fluid may also be adjusted, e.g., increased, reduced, started, and/or stopped.

It is desirable to perform environmental testing on many, e.g., hundreds, of integrated circuits at the same time, beneficially increasing manufacturing throughput. Unfortunately, individual control of the flow and/or temperature of cooling fluids to hundreds of cooling structures is prohibitively complex and deleteriously limiting of test density. For example, individual control of a flow of a cooling fluid for each integrated circuit under test may require two cooling fluid valves per device under test. Such hundreds to thousands of valves and associated actuators would greatly enlarge a size requirement for a test apparatus, and, due to all of the mechanical elements, would be unreliable. Similarly, individual control of cooling fluid temperature would be unwieldy employing the cooling mechanisms that use cooling liquids described above.

SUMMARY OF THE INVENTION

Therefore, what is needed are systems and methods for thermal solutions available for massively parallel testing. What is additionally needed are systems and methods for thermal solutions for massively parallel testing that reduce or eliminate a need to change a temperature of a cooling structure. There is a further need for systems and methods for thermal solutions for massively parallel testing that are compatible and complementary with existing systems and methods of testing integrated circuits.

In accordance with an embodiment of the present invention, an apparatus for thermal control of a device under test (DUT) includes a cooling structure operable to provide cooling, the cooling structure operable to inlet cooling material via an inlet port thereof and operable to outlet cooling material via an outlet, port thereof, a variable thermal conductance material (VTCM) layer disposed on a surface of the cooling structure, and a heater layer operable to generate heat based on an electronic control, and wherein the VTCM layer is operable to transfer cooling from the cooling structure to the heater layer. A thermal interface material layer is disposed on the heater layer. The thermal interface material layer is operable to provide thermal coupling and mechanical compliance with respect to the DUT. The apparatus includes a compression mechanism for providing compression to the VTCM layer to vary a thermal conductance of the VTCM layer. The compression mechanism is also for decoupling the VTCM layer from the heater layer.

Embodiments include the above and further include wherein a temperature of the thermal interface material layer is controlled by varying the electronic control to the heater layer and further by varying an amount of compression applied to the VTCM layer from the compression mechanism.

Embodiments include the above and further include wherein the compression mechanism includes a plunger that is pneumatically controlled.

Embodiments include the above and further include wherein the VTCM layer includes a material that varies in thermal conductance responsive to compression thereof.

Embodiments include the above and further include wherein the cooling material is a cooling liquid.

Embodiments include the above and further include wherein the heater layer includes a ceramic heater layer.

Embodiments include the above and further include wherein the heater layer includes an aluminum nitride layer.

Embodiments include the above and further include wherein the thermal interface material layer includes one of: indium; and graphite.

Embodiments include the above and further include wherein the thermal interface material layer includes an integrated temperature sensor.

Embodiments include the above and further include wherein the DUT is a packaged memory device.

In accordance with another embodiment of the present invention, an apparatus for thermal control of a device under test (DUT) includes a cooling structure operable to provide cooling and including an inlet port and an outlet port, the cooling structure operable to inlet cooling liquid via the inlet port thereof and operable to outlet cooling liquid via the outlet port a variable thermal conductance material (VTCM) layer disposed on a surface of the cooling structure, wherein a thermal conductance characteristic of the VTCM varies with compression thereof, and a heater layer operable to generate heat based on an electronic control signal, and wherein the VTCM layer is operable to transfer cooling from the cooling structure to the heater layer. The apparatus further includes a thermal interface material layer disposed on the heater layer, wherein the thermal interface material layer is operable to provide thermal coupling and mechanical compliance with respect to the DUT, a socket alignment layer disposed between the VTCM layer and the heater layer; and a compression mechanism for providing compression to the VTCM layer to vary the thermal conductance characteristic thereof.

Embodiments include the above and further include wherein a temperature of the thermal interface material layer is controlled by varying the electronic control to the heater layer and further by varying an amount of compression applied to the VTCM layer from the compression mechanism.

Embodiments include the above and further include wherein the compression mechanism is a plunger that is pneumatically controlled.

Embodiments include the above and further include wherein the heater layer includes a ceramic heater layer.

Embodiments include the above and further include wherein the heater layer includes an aluminum nitride layer.

Embodiments include the above and further include wherein the thermal interface material layer includes one of: indium; and graphite.

Embodiments include the above and further include wherein the thermal interface material layer includes an integrated temperature sensor.

Embodiments include the above and further include wherein the DUT is a packaged memory device.

In accordance with further embodiments of the present invention, an apparatus for performing thermal control and testing of a device under test (DUT) includes a cooling structure operable to provide cooling, the cooling structure operable to inlet cooling liquid and operable to outlet cooling liquid, a variable thermal conductance material (VTCM) layer disposed on a surface of the cooling structure, wherein a thermal conductance characteristic of the VTCM varies with compression thereof, and a heater layer operable to generate heat based on an electronic control. The VTCM layer is operable to transfer cooling from the cooling structure to the heater layer. The apparatus further includes a thermal interface material layer disposed on the heater layer, wherein the thermal interface material layer is operable to provide thermal coupling and mechanical compliance with respect to the DUT, a compression mechanism for providing compression to the VTCM layer to vary a thermal conductance of the VTCM layer. The apparatus further includes a computer system for implementing a method of testing the DUT, The method includes applying input test signals to DUT and retrieving output signals from the DUT responsive to the input test signals.

Embodiments include the above and further include wherein the thermal interface material layer further includes an integrated temperature sensor; and wherein the method further includes varying a temperature of the DUT by varying the electronic control to the heater layer and further by varying an amount of compression applied to the VTCM layer from the compression mechanism, both responsive to the integrated temperature sensor.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

DETAILED DESCRIPTION

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Thermal Solution for Massively Parallel Testing

Figure 1:
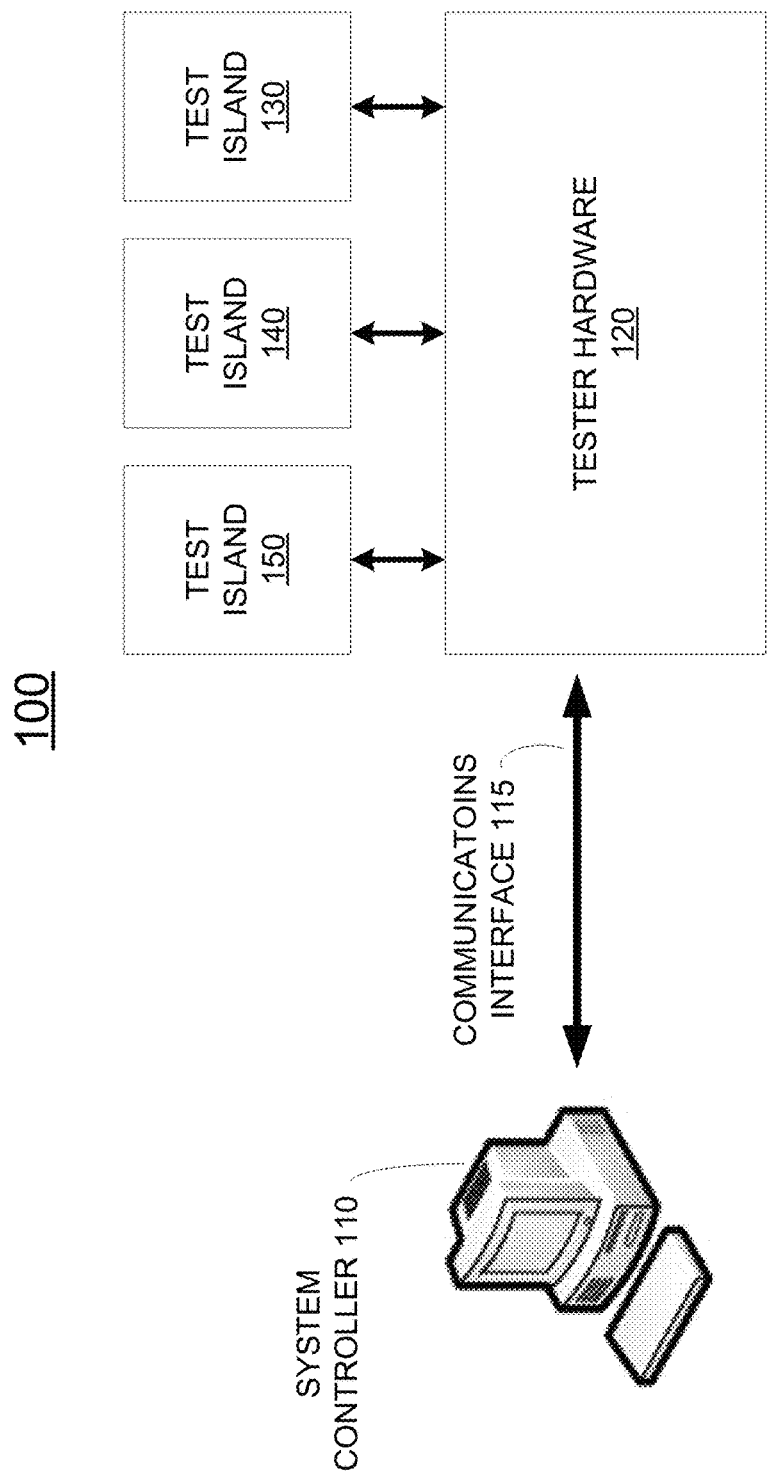
FIG. 1 illustrates an exemplary block diagram of an automated test system environment that may serve as a platform for embodiments accordance with the present invention.

FIG. 1 illustrates an exemplary block diagram of an automated test system environment 100 that may serve as a platform for embodiments in accordance with the present invention. Test system 100 comprises a system controller 110, which may be, for example, a general-purpose computer system with special programming for the test application. Communications interface 115 functionally couples system controller 110 with tester hardware 120. Tester hardware 120 provides electrical and mechanical support for test islands 130, 140, 150. For example, tester hardware 120 may provide a cooling fluid to test islands 130, 140, 150. Tester hardware 120 generally provides electrical power and functional test signals to, and generally controls the testing of devices on test islands 130, 140, 150. In general, there will be more than the illustrated three test islands in a test environment.

Each test island 130, 140, 150 may comprise test, support for hundreds of devices under test (DUTs). For example, a teat island may comprise test support for 144 or 512 integrated circuit devices. A test Island may comprise physical support and mounting for each device under test and an electrical interface for each device under test, e.g., for power and communication of test patterns. In accordance with embodiments of the present invention, a test island includes an individual device under test environmental unit, further described below, for each device under test.

Figure 2:
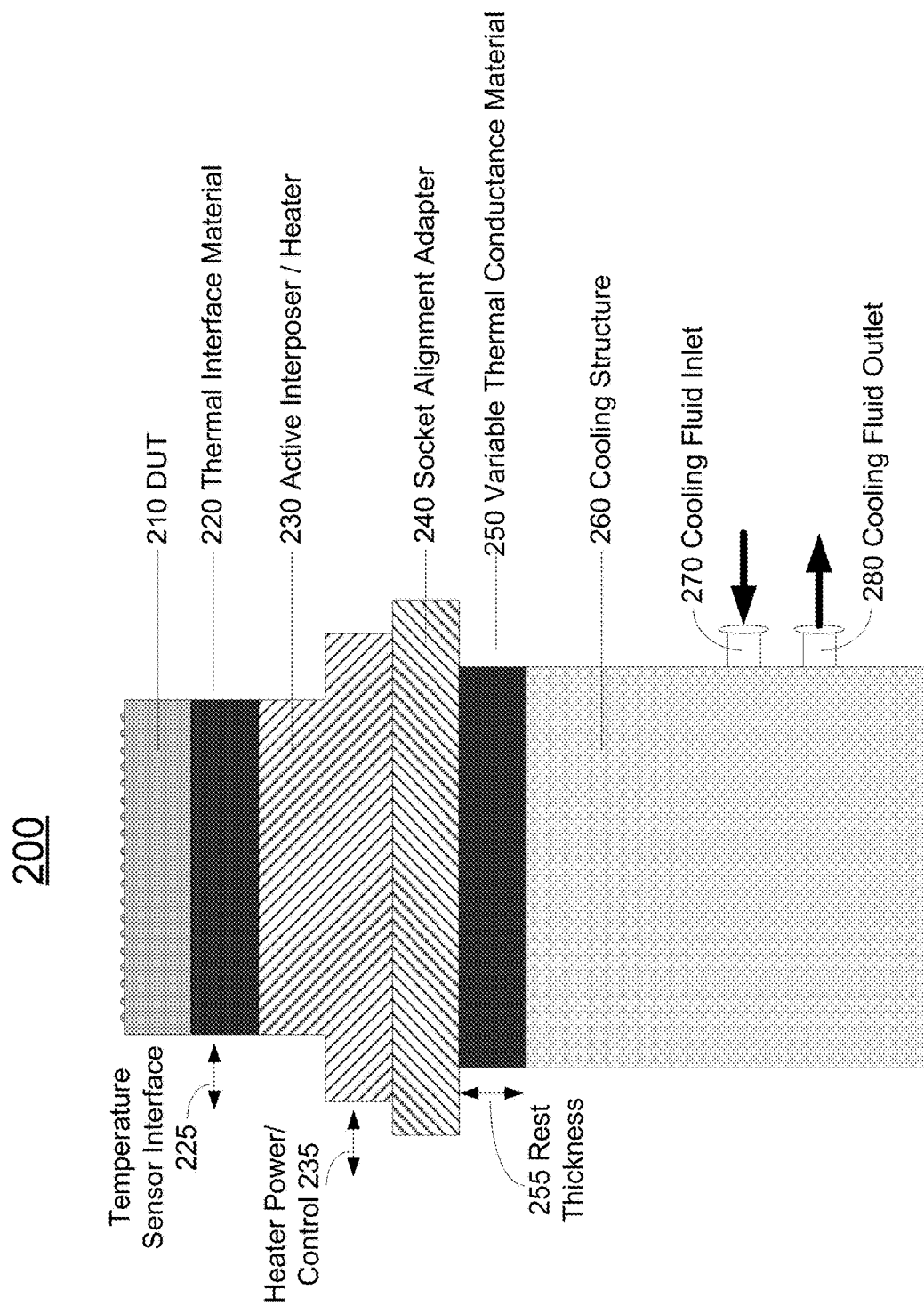
FIG. 2 illustrates an exemplary cross sectional block diagram of a novel individual device under test (DUT) environmental control unit, comprising both heating and cooling functionality, in accordance with embodiments of the present: invention.

FIG. 2 illustrates an exemplary cross sectional block diagram of a novel individual device under test (DUT) environmental control unit 200, comprising both heating and cooling functionality, in accordance with embodiments of the present invention. Environmental control unit 200 is designed to adjust and/or control a temperature of a single device under test 210. A typical test environment may comprise a plurality, e.g., several hundreds, of environmental control units mechanically coupled together, e.g., side to side in the view of FIG. 2, to provide individual environmental control for a corresponding plurality of devices under test.

DUT 210 is illustrated as packaged in a ball grid array (BGA) package. Embodiments in accordance with the present invention are well suited to other types of packaging for integrated circuits, including multi-chip modules, and are further well suited to testing unpackaged integrated circuit devices. In some embodiments, there may be a plurality of electrical connections coupling DUT 210 to automated test equipment (not shown) to provide electrical power and/or perform electrical tests, ft is appreciated that environmental control unit 200 is not limited to testing integrated circuits and/or multi-chip modules. Rather, embodiments in accordance with the present invention are well suited to controlling temperature of a wide variety of systems.

Environmental control unit 200 comprises a cooling structure 260. Cooling structure 260 is configured to absorb or "sink" heat from other portions of environmental control unit 200 and/or DUT 210. Cooling structure 260 typically comprises highly thermally conductive materials, including, for example, metals. Cooling structure 260 may also comprise multi-material structures, for example, a structural material with low thermal conductivity in combination, e.g., filled, with a higher thermal conductivity material. Cooling structure 260 is configured to receive a cooling fluid via controllable inlet port 270, and discharge cooling fluid via controllable outlet port 280. Inlet port 270 and/or outlet port 280 may comprise a valve (not shown) in some embodiments. The cooling fluid may be inlet, at a temperature of −60 degrees C., in seine embodiments.

Environmental control unit 200 comprises a thermal interface material 220. Thermal interface material 220 is configured to provide a highly conductive and physically conformal interface between DUT 210 and the rest of environmental control unit 200. Thermal interface material 220 may comprise a built-in temperature sensor, e.g., a thermocouple (not shown). In some embodiments, a temperature sensor may be included in active interposer or heater 230, further described below. The temperature sensor has a temperature sensor interface 225 that communicates with a test controller (not shown).

Thermal interface material 220 is coupled to an active interposer or heater 230. Active interposer 230 is configured to apply thermal energy to DUT 210 via thermal interface material 220. Active interposer 230 may comprise a ceramic heater and/or a cartridge heater, in some embodiments. Active interposer 230 receives electrical power and/or control via interface 235. Active interposer 230 is highly thermally conductive, in some embodiments. Active interposer 230 may comprise a number of traces used as heating elements for controlling the head produce thereby.

Active interposer 230 is coupled to a socket alignment adapter 240. Socket alignment adapter 240 provides mechanical and spatial compliance and functions to align the stack of environmental control unit 200 with DUT 210 and its electrical test interface (not shown). Socket alignment adapter 240 is highly thermally conductive, in some embodiments.

The socket alignment adapter 240 is coupled to cooling structure 260 via variable conductance material 250. Variable resistance material 250 is characterized as having a thermal conductance that varies with an amount of compression and/or pressure applied to the material. For example, when variable conductance material 250 is compressed relative to its rest thickness 255, its thermal conductance increases, e.g., it conducts heat energy better than when at its rest thickness 255. By way of further example, when variable conductance material 250 is compressed a relatively large amount in comparison to its rest thickness 255, its thermal conductivity is increased more than when variable conductance material 250 is compressed by a relatively lesser amount. Embodiments in accordance with the present invention are also well suited to a variable conductance material characterized as decreasing its thermal conductance as it is compressed and/or has pressure applied.

Figure 3:
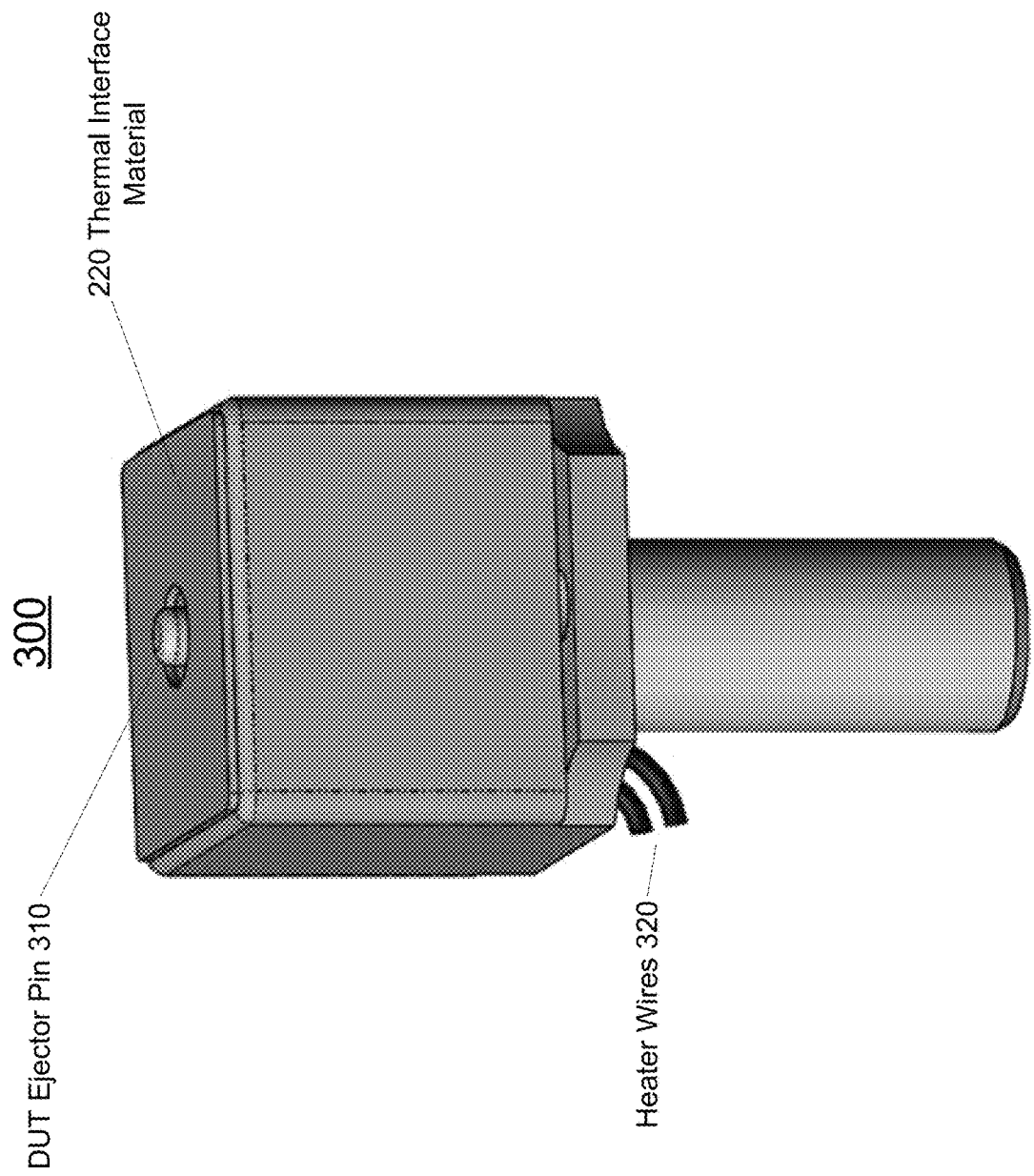
FIG. 3 illustrates an exemplary perspective view of diagram of a novel individual device under test (DUT) environmental control unit, in accordance with embodiments of the present invention. Environmental

FIG. 3 illustrates an exemplary perspective view of diagram of a novel individual device under test (DUT) environmental control unit 300, in accordance with embodiments of the present invention. Environmental control unit 300 comprises a therinail interface material 220 on its top, configured to make thermal contact with a device under test (not shown). In some embodiments, environmental control unit 300 comprises a device under test (DUT) ejector pin 310, configured to ease removal of a device under test. Environmental control unit 300 may also comprise wires 320 to couple a heater element (not shown) to a power source, in some embodiments.

Figure 4:
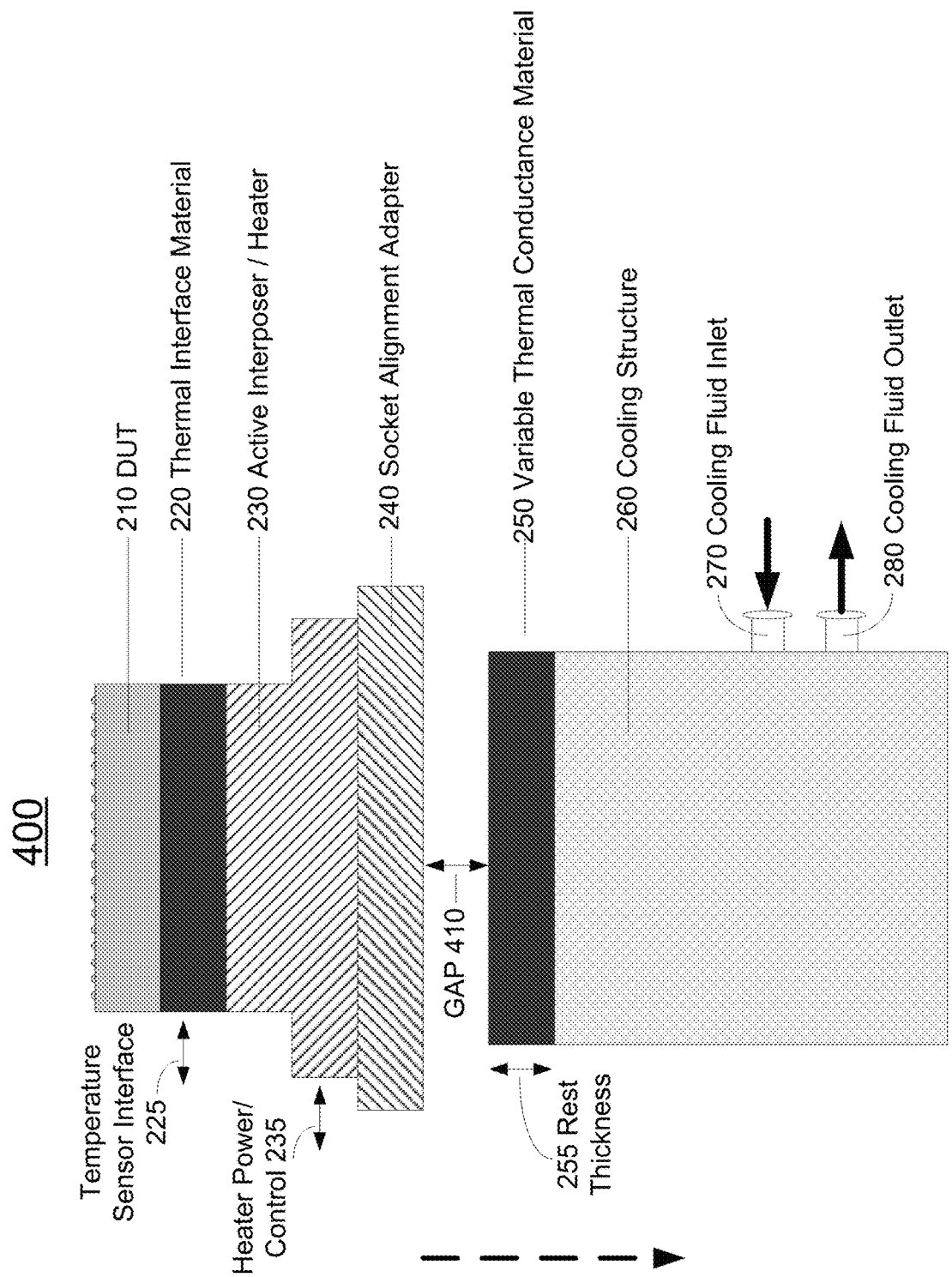
FIG. 4 illustrates an exemplary cross sectional block diagram of a novel individual device under test (DUT) environmental control unit in a heating mode, having heating elements and an air gap to the cooling elements, in accordance with embodiments of the present, invention.

FIG. 4 illustrates an exemplary cross sectional block diagram of a novel individual device under test (DUT) environmental control unit 400 in a heating mode, having heating elements and an air gap to the cooling elements, in accordance with embodiments of the present invention. For example, when the temperature of DLIT 210 is less than desired, the configuration of FIG. 4 may be used to raise and/or maintain a desired high temperature for DUT 210.

In the FIG. 4 embodiment, the cooling structure 260 and variable thermal conductance material 250 have been thermally decoupled from DUT 210 by a gap 410. Cooling structure 260 and variable thermal conductance material 250 have been moved downward in the view of FIG. 4 such that a gap 410 physically and thermally separates cooling structure 260 and variable thermal conductance material 250 from socket alignment adapter 240 and the other elements of environmental control unit 400. The cooling structure 260 and variable thermal conductance material 250 may be moved by any suitable means, including, for example, via a pneumatic cylinder, linear motor(s), piezo-electric device(s), memory shape materials, springs, electro-magnets, solenoids, servos, and the like.

In order to apply heat energy to DUT 210, active interposer/heater 230 may be controlled to produce heat energy. Since the cooling structure 260 is decoupled from the active interposer/heater 230 and the DUT 210, substantially all of the heat output of the active interposer/heater 230 is available for thermal coupling into DUT 210.

Advantageously, since the cooling structure 260 is decoupled from the DUT 210 by gap 410, it is not necessary to change the temperature of the cooling structure 260. For example, the flow rate and/or temperature of a cooling fluid applied to the cooling structure 260 need not be changed. Beneficially, since the flow rate and/or temperature of a cooling fluid applied to the cooling structure 260 need not be changed, the control of the cooling fluid is greatly simplified. For example, the temperature of the cooling fluid may not be monitored and/or controlled, or the requirements for controlling temperature may be reduced. The flow rate of the cooling fluid may not be monitored and/or controlled, or the requirements for controlling flow rate may be reduced. In some embodiments, requirements for valves to control a flow rate of the cooling fluid may be decreased in comparison to the conventional art. For example, cooling fluid valves may be decreased in quantity and/or functionality, e.g., valves may not have a partial flow capacity. In some embodiments, there may not be valves to control flow to individual instances of cooling structure 260.

In addition, since the cooling structure 260 is decoupled from the active interposer/heater 230 and the DUT 210, the heating capacity of the active interposer/heater 230 may be beneficially reduced in comparison to the prior art, since active interposer/heater 230 is not required to overcome the active or latent heat absorption of cooling structure 260. Such a reduction in the requirements of active interposer/heater 230 may lead to reductions in size, cost, complexity and/or power consumption of an automated test system.

Figure 5:
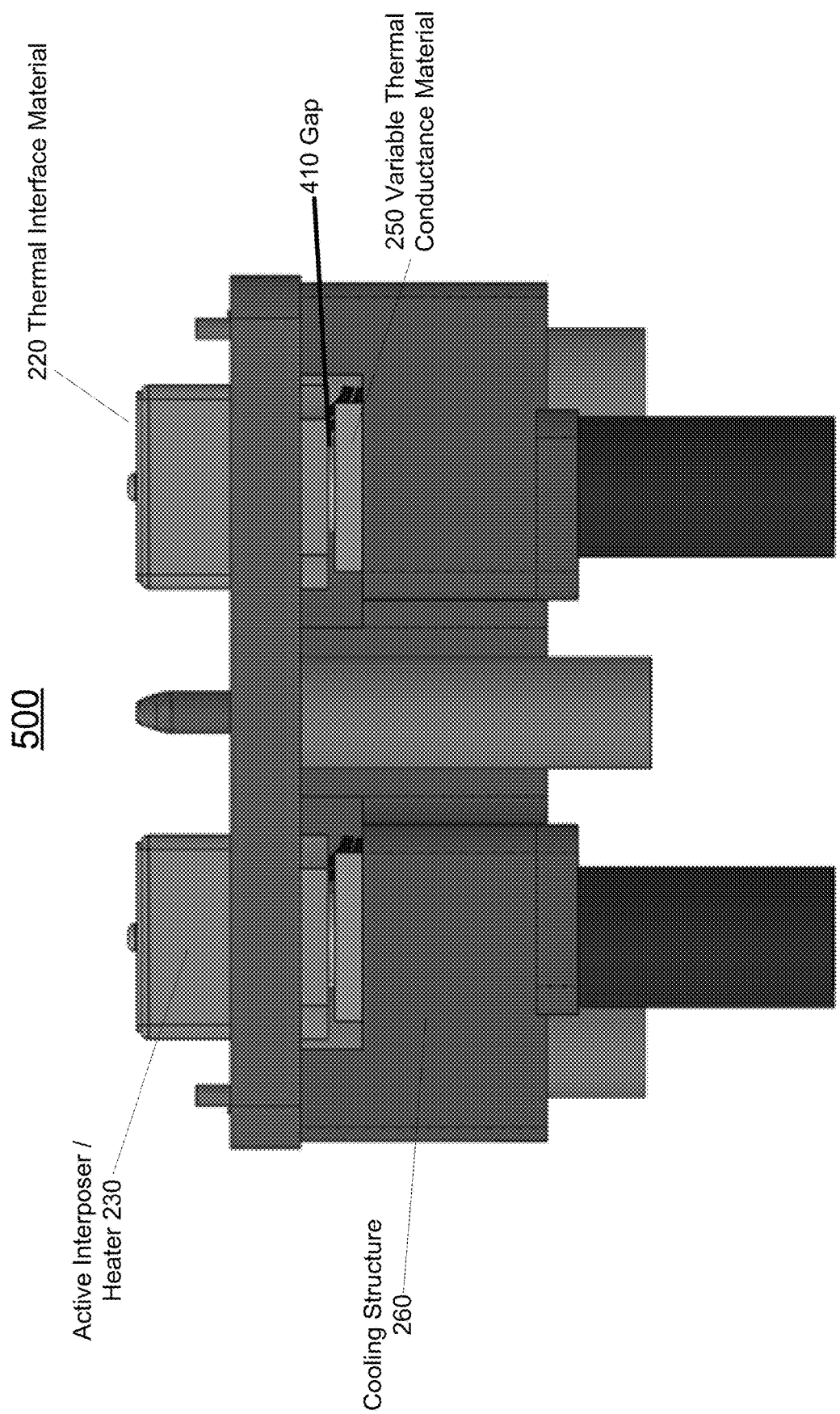
FIG. 5 illustrates an exemplary block diagram of a novel dual device under test (DUT) environmental control unit, in accordance with embodiments of the present invention. As FIG. 6 illustrates an exemplary cross sectional block diagram of a novel individual device under test. (DUT) environmental control unit in a cooling mode, in accordance with embodiments of the present invention.

FIG. 5 illustrates an exemplary block diagram of a novel dual device under test (DUT) environmental control unit 500, in accordance with embodiments of the present invention. As with the FIG. 4 embodiment, dual device under test (DUT) environmental control unit 500 is illustrated in a heating configuration, with a gap 410 thermally decoupling the cooling structure 260 from the active interposer 230.

Figure 6:
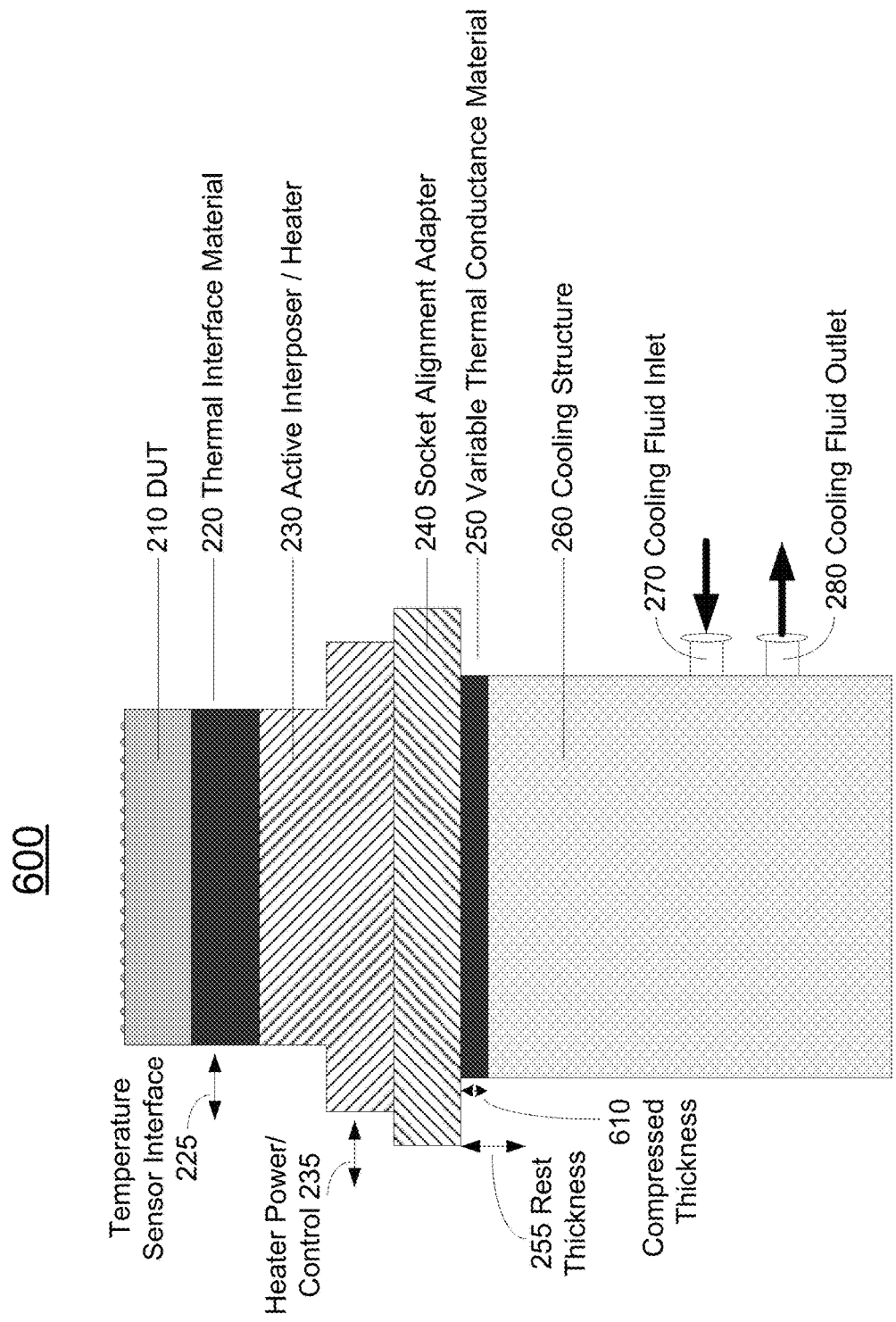

FIG. 6 illustrates an exemplary cross sectional block diagram of a novel individual device under test (DUT) environmental control unit 600 in a cooling mode, in accordance with embodiments of the present invention. For example, when the temperature of DUT 210 is greater than desired, the configuration of FIG. 6 may be used to lower and/or maintain a desired low temperature for DUT 210.

In the embodiment of FIG. 6, the variable thermal conductance material 250 has been compressed to the maximum extent, e.g., to compressed thickness 610, thereby affording it its maximum thermal conductance. Active interposer/heater 280 is turned off, and a minimum thermal conductance from DUT 210 to cooling structure 260 is achieved. The embodiment of FIG. 6 will drive the temperature of DUT 210 toward the temperature of cooling structure 260.

Figure 7:
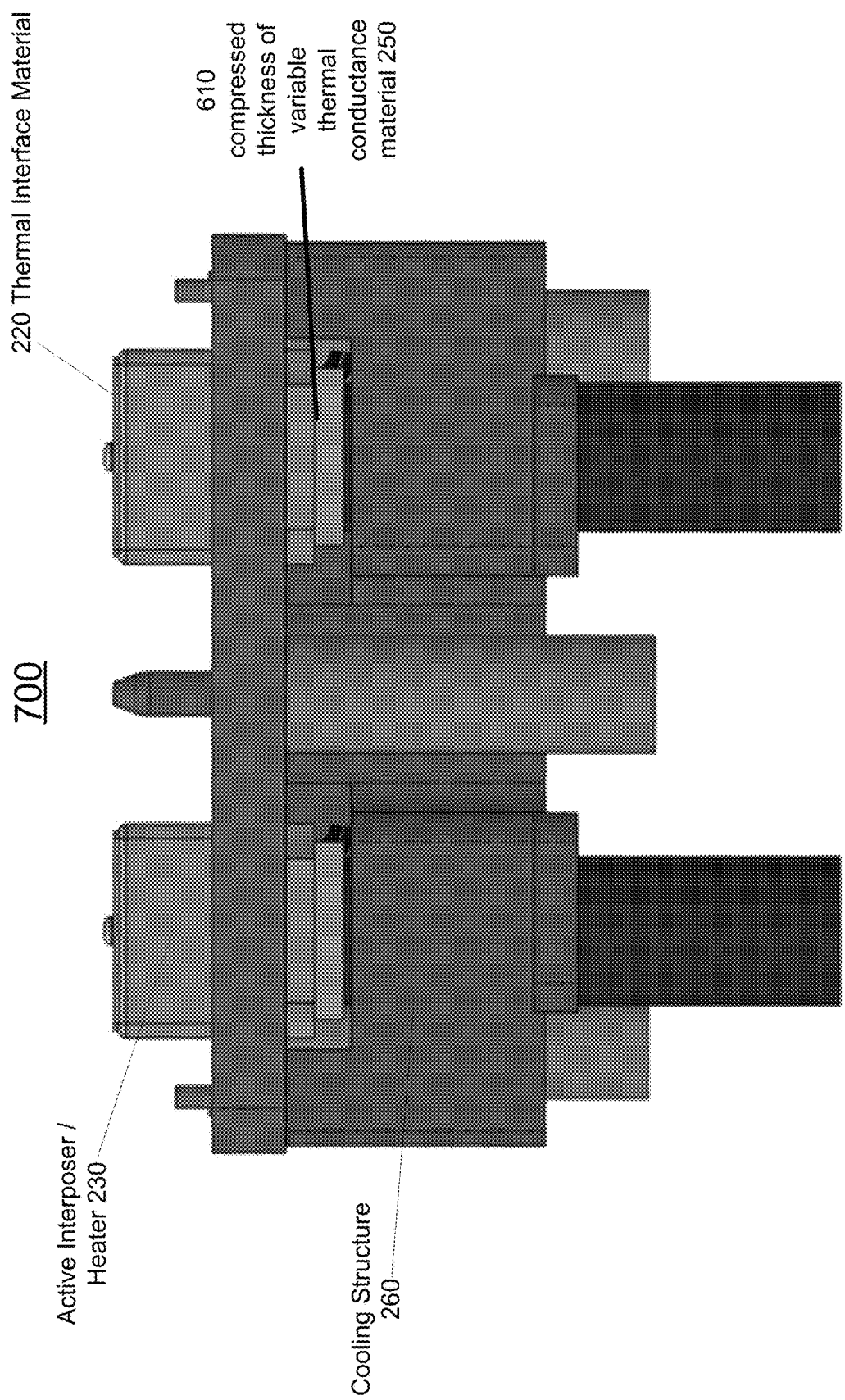
FIG. 7 illustrates an exemplary block diagram of a novel dual device under test (DUT) environmental control unit, in accordance with embodiments of the present invention.

FIG. 7 illustrates an exemplary block diagram of a novel dual device under test (DUT) environmental control unit 700, in accordance with embodiments of the present invention. As with the FIG. 6 embodiment, dual device under test (DUT) environmental control unit 700 is illustrated in a cooling configuration, with a decreased gap 610 compressing the variable thermal conductance material 250 and thermally coupling the cooling structure 260 to the active interposer 230.

Figure 8:
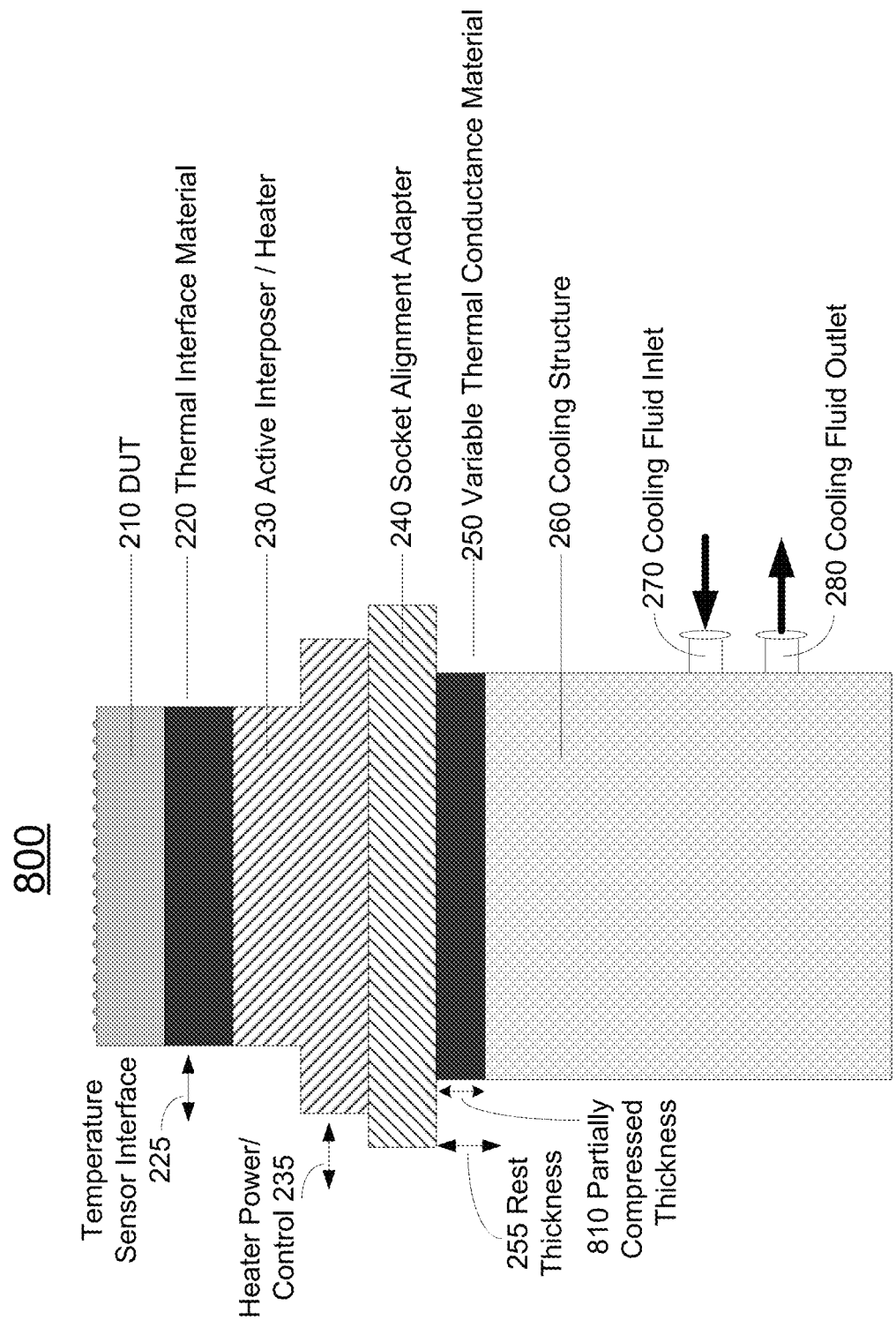
FIG. 8 illustrates an exemplary block diagram of a novel individual device under test (DUT) environmental control unit in a lesser cooling mode, in accordance with embodiments of the present invention.

If a lesser amount of cooling is desired, for example, the temperature of cooling structure 260 is colder than the desired temperature for DUT 210, the embodiment of FIG. 8 may be utilized. FIG. 8 illustrates an exemplary cross sectional diagram of a novel individual device under test (DLT) environmental control unit 800 in a lesser cooling mode, in accordance with embodiments of the present invention. For example, when the temperature of DUT 210 is greater than desired, the configuration of FIG. 8 may be used to lower and/or maintain a desired low temperature for DUT 210.

In the embodiment of FIG. 8, the variable thermal conductance material 250 is compressed to a lesser amount 810 than the compressed thickness 610 of FIG. 6, but is compressed to a greater amount than the rest thickness 255. Partially compressed thickness 810 is less than rest thickness 255 and greater than compressed thickness 610. Due to the decreased thermal conductance of variable thermal conductance material 250, corresponding to the relatively decreased compression of variable thermal conductance material 250, cooling structure 260 will not absorb as much heat, as in the configuration of FIG. 6. Consequently, DUT 210 cooled at a lesser rate than in the configuration of FIG. 6, and will have a higher final temperature than in the configuration of FIG. 6. The compression of, or pressure applied to, variable thermal conductance material 250 may be changed to control the thermal conductance of variable thermal conductance material 250 and in turn control the amount of heat absorbed by cooling structure 280.

In this novel manner, a device under test, e.g., DUT 210, may be controlled, heated and/or cooled, to a desirable temperature without changing the temperature of a cooling structure, e.g., cooling structure 260. For example, an amount of cooling may be varied according to the thickness and/or compression of variable thermal conductance material 250, or decoupling variable thermal conductance material 250 from DUT 210 by a gap 410 (FIG. 4). For example, an amount and/or temperature of a cooling fluid provided to cooling structure 260 does not need to be measured and/or controlled. Accordingly, the plumbing, e.g., cooling fluid valves, as well as cooling fluid measurement and control requirements to each instance of an individual device under test (DUT) environmental control unit 200 may be reduced, allowing for beneficial increases in density of environmental control units and devices under test. For example, under the conventional art, a cooling structure would typically require two valves to regulate a flow of cooling fluid. With the elimination of such valves in accordance with embodiments of the present invention, a plurality of individual environmental control units may be implemented at an advantageous higher density, in comparison to the conventional art.

Figure 9:
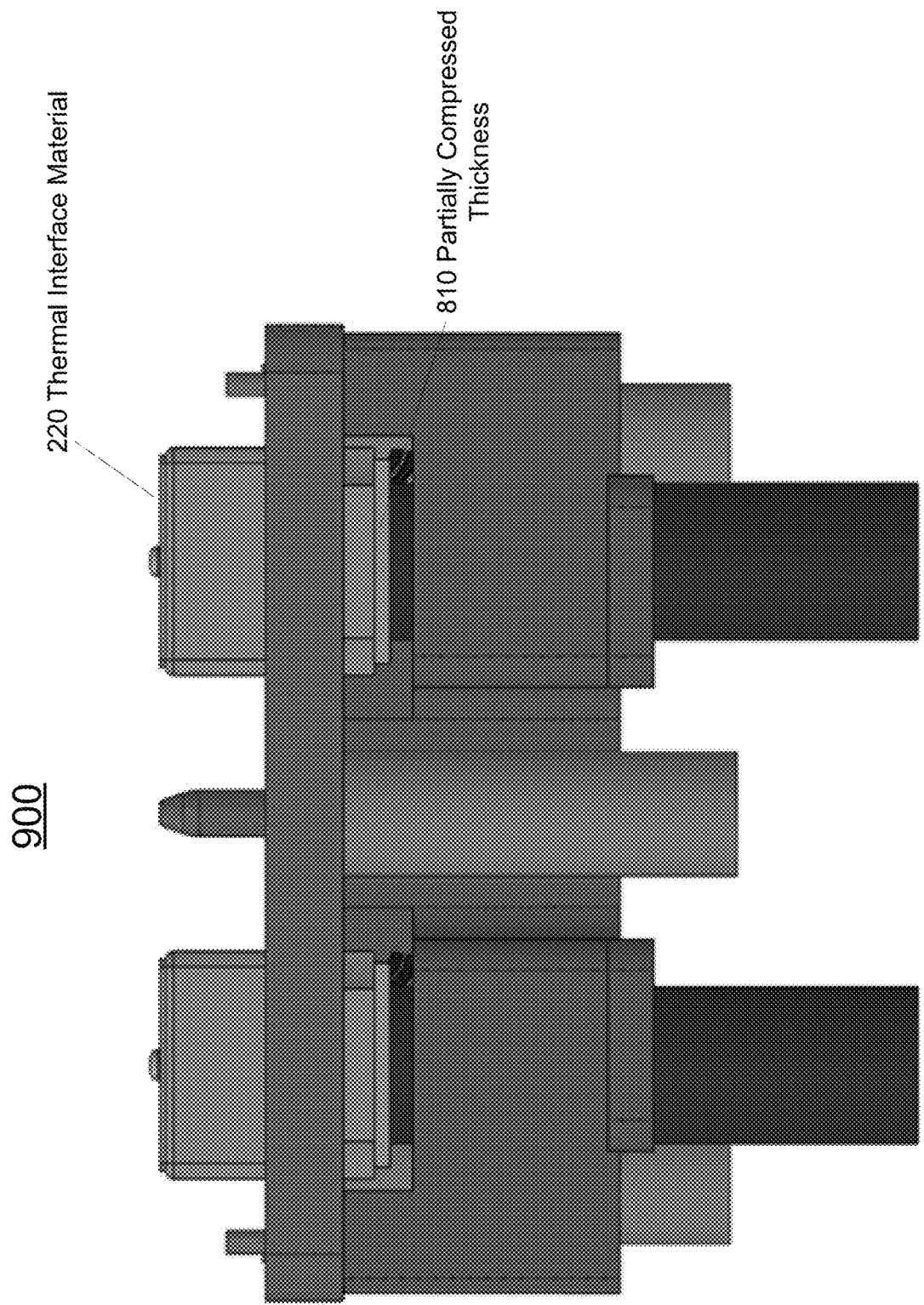
FIG. 9 illustrates an exemplary block diagram of a novel dual device under test (DUT) environmental control unit 900, in accordance with embodiments of the present invention.

FIG. 9 illustrates an exemplary block diagram of a novel dual device under test (DUT) environmental control unit 900, in accordance with embodiments of the present invention. As with the FIG. 8 embodiment, dual device under test (DUT) environmental control unit 700 is illustrated in a cooling configuration, with a decreased gap 810 partially compressing the variable thermal conductance material 250 and thermally coupling the cooling structure 260 to the active interposer 230.

Figure 10:
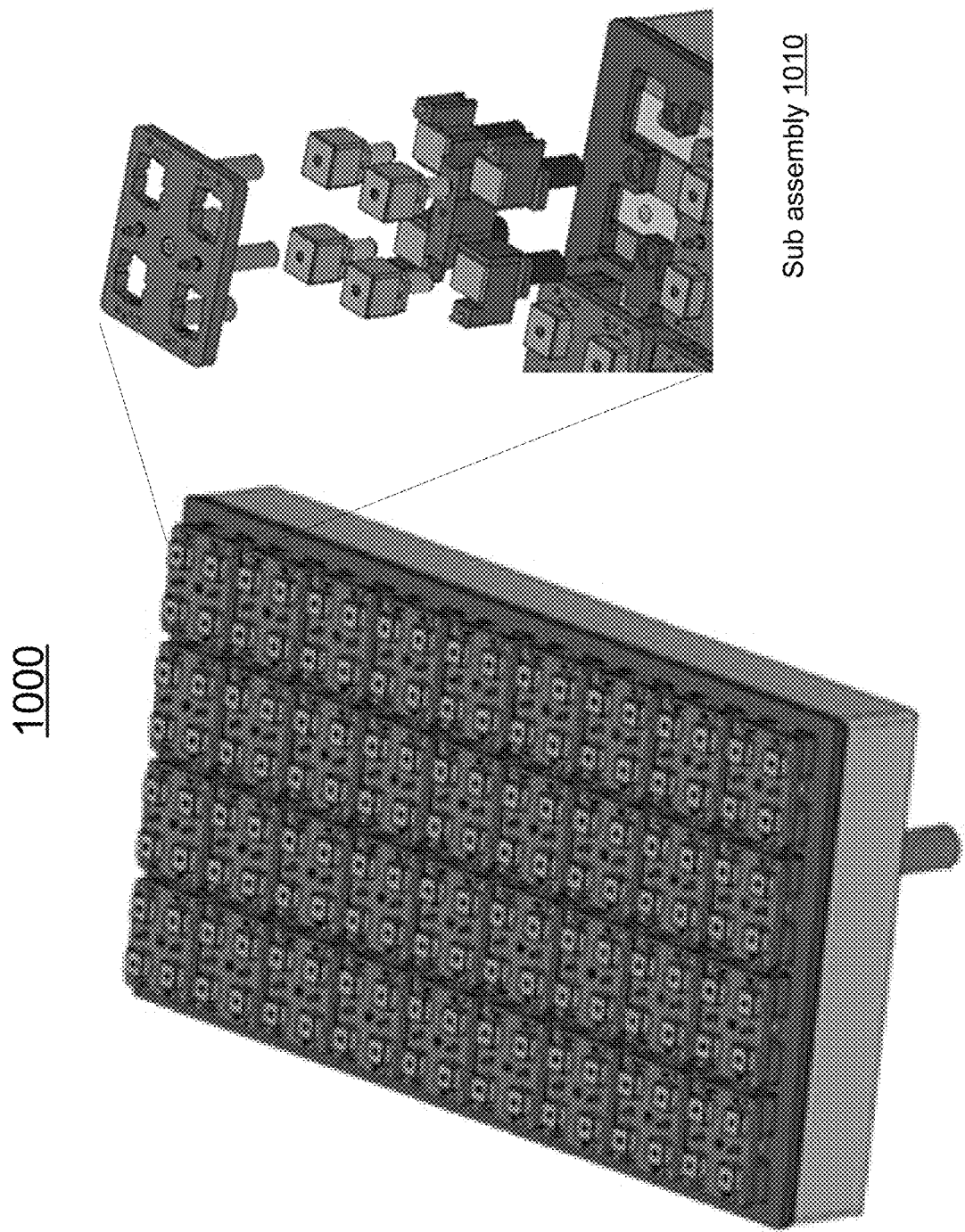
FIG. 10 is a perspective block diagram of an exemplary multi-unit environmental test platform, in accordance with embodiments of the present invention.

FIG. 10 is a perspective block diagram of an exemplary multi-unit environmental test platform 1000, in accordance with embodiments of the present invention. Test platform 100 is configured to test, for example, 144 devices under test. In an embodiment, test platform 1000 is configured as an assembly of 36 sub assemblies 1010. Each sub assembly 1010 is configured to test ten devices under test. For example, each sub assembly 1010 comprises four environmental control units, e.g., environmental control units comparable to environmental control unit 200 as described in FIG. 2.

Figure 11:
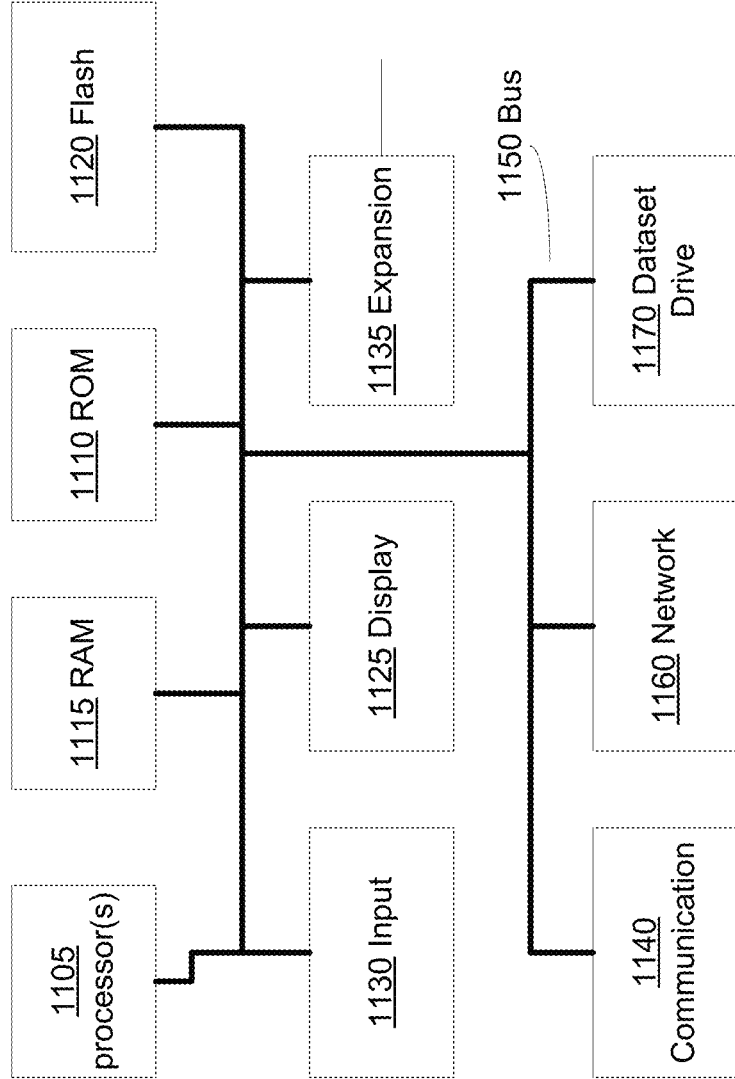
FIG. 11 illustrates a block diagram of an exemplary electronic system, which may be used as a platform to implement and/or as a control system for embodiments of the present invention.

FIG. 11 illustrates a block diagram of an exemplary electronic system 1100, which may be used as a platform to implement and/or as a control system, e.g., system controller 110 as described in FIG. 1, for embodiments of the present invention. Electronic system 1100 may be a "server" computer system, in some embodiments. Electronic system 1100 includes an address/data bus 1150 for communicating information, a central processor complex 1105 functionally coupled with the bus for processing information and instructions. Bus 1150 may comprise, for example, a Peripheral Component. Interconnect: Express (PCIe) computer expansion bus, industry standard architecture (ISA), extended ISA (EISA), MicroChannel, Multibus, IEEE 796, IEEE 1196, IEEE 1496 PCI, Computer. Automated Measurement and Control (CAMAC). MBus, Runway bus, Compute Express Link (CXL), and the like.

Central processor complex 1105 may comprise a single processor or multiple processors, e.g., a multi-core processor, or multiple separate processors, in some embodiments. Central processor complex 1105 may comprise various types of well-known processors in any combination, including, for example, digital signal processors (DSP), graphics processors (GPU), complex instruction set (CISC) processors, reduced instruction set (RISC) processors, and/or very long word instruction set (VLIW) processors. In some embodiments, exemplary central processor complex 1105 may comprise a finite state machine, for example, realized in one or more field programmable gate array(s) (FPGA), which may operate in conjunction with and/or replace other types of processors to control embodiments in accordance with the present invention.

Electronic system 1100 may also include a volatile memory 1115 (e.g., random access memory RAM) coupled with the bus 1150 for storing information and instructions for the central processor complex 1105, and a non-volatile memory 1110 (e.g., read only memory ROM) coupled with the bus 1150 for storing static information and instructions for the processor complex 1105. Electronic system 1300 also optionally includes a changeable, non-volatile memory 1120 (e.g., NOR flash) for storing information and instructions for the central processor complex 1105 which can be updated after the manufacture of system 1100. In some embodiments, only one of ROM 1110 or Flash 1120 may present.

Also included in electronic system 100 of FIG. 11 is an optional input device 1130. Device 1130 can communicate information and command selections to the central processor 1100. Input device 1130 may be any suitable device for communicating information and/or commands to the electronic system 1100. For example, input device 1130 may take the form of a keyboard, buttons, a joystick, a track ball, an audio transducer, e.g., a microphone, a touch sensitive digitized panel, eyeball scanner, and/or the like.

Electronic system 1100 may comprise a display unit 1125, Display unit 1125 may comprise a liquid crystal display (LCD) device, cathode ray tube (CRT), field emission device (FED, also called flat panel CRT), light emitting diode (LED), plasma display device, electro-luminescent display, electronic paper, electronic ink (e-ink) or other display device suitable for creating graphic images and/or alphanumeric characters recognizable to the user. Display unit 1125 may have an associated lighting device, in some embodiments.

Electronic system 1100 also optionally includes an expansion interface 1135 coupled with the bus 1150. Expansion interface 1135 can implement many well known standard expansion interfaces, including without limitation the Secure Digital Card interface, universal serial bus (USB) interface, Compact Flash, Personal Computer (PC) Card interface, CardBus, Peripheral Component Interconnect (PCT) interface, Peripheral Component Interconnect Express (PCI Express), mini-PCI interface. IEEE 1394, Small Computer System Interface (SCSI), Personal Computer Memory Card International Association (PCMCIA) interface, Industry Standard Architecture (ISA) interface, RS-232 interface, and/or the like. In some embodiments of the present invention, expansion interface 1135 may comprise signals substantially compliant with the signals of bus 1150, A wide variety of well-known devices may be attached to electronic system 1100 via the bus 1150 and/or expansion interface 1135, Examples of such, devices include without limitation rotating magnetic memory devices, flash memory devices, digital cameras, wireless communication modules, digital audio players, and Global Positioning System (GPS) devices.

System 1100 also optionally includes a communication port 1140. Communication port 1140 may be implemented as part of expansion interface 1135. When implemented as a separate interface, communication port 1140 may typically be used to exchange information with other devices via communication-oriented data transfer protocols. Examples of communication ports include without limitation RS-232 ports, universal asynchronous receiver transmitters (UARTs), USB ports, infrared light transceivers, ethernet ports IEEE 1394, and synchronous ports.

System 1100 optionally includes a network interface 1160, which may implement a wired or wireless network interface. Electronic system 1100 may comprise additional software and/or hardware features (not shown) in some embodiments.

Various modules of system 1100 may access computer readable media, and the term is known or understood to include removable media, for example, Secure Digital ("SD") cards, CD and/or DVD ROMs, diskettes and the like, as well as non-removable or internal media, for example, hard drives, solid state drive s (SSD), RAM, ROM, flash, and the like.

Embodiments in accordance with the present invention provide systems and methods for thermal solutions for massively parallel testing, in addition, embodiments in accordance with the present invention provide systems and methods for thermal solutions for massively parallel testing that reduce or eliminate a need to change a temperature of a cooling structure. Further, embodiments in accordance with the present invention provide systems and methods for thermal solutions for massively parallel testing that are compatible and complementary with existing systems and methods of testing integrated circuits.

Although the invention has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

Various embodiments of the invention are thus described. While the present invention has been described in particular embodiments, it should be appreciated that the invention should not be construed as limited by such embodiments, but rather construed according to the below claims.

What is claimed is:

1. An apparatus for thermal control of a device under test (DUT), the apparatus comprising:
   a cooling structure operable to provide cooling, said cooling structure operable to inlet cooling material via an inlet port thereof and operable to outlet cooling material via an outlet port thereof;
   a variable thermal conductance material (VTCM) layer disposed on a surface of said cooling structure;
   a heater layer operable to generate heat based on an electronic control, and wherein said VTCM layer is operable to transfer cooling from said cooling structure to said heater layer;
   a thermal interface material layer disposed on said heater layer, and operable to provide thermal coupling and mechanical compliance with respect to said DUT; and
   a compression mechanism for providing compression to said VTCM layer to vary a thermal conductance of said VTCM layer, wherein
   said compression mechanism is also for decoupling said VTCM layer from said heater layer.

2. An apparatus as described in claim 1 wherein a temperature of said thermal interface material layer is controlled by varying said electronic control to said heater layer and further by varying an amount of compression applied to said VTCM layer from said compression mechanism.

3. An apparatus as described in claim 1 wherein said compression mechanism comprises a plunger that is pneumatically controlled.

4. An apparatus as described in claim 1 wherein said VTCM layer comprises a material that varies in thermal conductance responsive to compression thereof.

5. An apparatus as described in claim 1 wherein said cooling material is a cooling liquid.

6. An apparatus as described in claim 1 wherein said heater layer comprises a ceramic heater layer.

7. An apparatus as described in claim 1 wherein said heater layer comprises an aluminum nitride layer.

8. An apparatus as described in claim 1 wherein said thermal interface material layer comprises one of: indium; and graphite.

9. An apparatus as described in claim 8 wherein said thermal interface material layer comprises an integrated temperature sensor.

10. An apparatus as described in claim 1 wherein said DUT is a packaged memory device.

11. An apparatus for thermal control of an electronic device under test (DUT), the apparatus comprising:
    a cooling structure operable to provide cooling and comprising an inlet port and an outlet port, said cooling structure operable to inlet cooling liquid via the inlet port thereof and operable to outlet cooling liquid via the outlet port;
    a variable thermal conductance material (VTCM) layer disposed on a surface of said cooling structure, wherein a thermal conductance characteristic of said VTCM varies with compression thereof;
    a heater layer operable to generate heat based on an electronic control signal, and wherein said VTCM layer is operable to transfer cooling from said cooling structure to said heater layer;
    a thermal interface material layer disposed on said heater layer, wherein said thermal interface material layer is operable to provide thermal coupling and mechanical compliance with respect to said (DUT);
    a socket alignment layer disposed between said VTCM layer and said heater layer; and
    a compression mechanism for providing compression to said VTCM layer to vary said thermal conductance characteristic thereof.

12. An apparatus as described in claim 11 wherein a temperature of said thermal interface material layer is controlled by varying said electronic control to said heater layer and further by varying an amount of compression applied to said VTCM layer from said compression mechanism.

13. An apparatus as described in claim 11 wherein said compression mechanism is a plunger that is pneumatically controlled.

14. An apparatus as described in claim 11 wherein said heater layer comprises a ceramic heater layer.

15. An apparatus as described in claim 11 wherein said heater layer comprises an aluminum nitride layer.

16. An apparatus as described in claim 11 wherein said thermal interface material layer comprises one of: indium; and graphite.

17. An apparatus as described in claim 11 wherein said thermal interface material layer comprises an integrated temperature sensor.

18. An apparatus as described in claim 11 wherein said DUT is a packaged memory device.

19. An apparatus for performing thermal control and testing of a device under test (DUT), the apparatus comprising:

a cooling structure operable to provide cooling, said cooling structure operable to inlet cooling liquid and operable to outlet cooling liquid;

a variable thermal conductance material (VTCM) layer disposed on a surface of said cooling structure, wherein a thermal conductance characteristic of said VTCM varies with compression thereof;

a heater layer operable to generate heat based on an electronic control, and wherein said VTCM layer is operable to transfer cooling from said cooling structure to said heater layer;

a thermal interface material layer disposed on said heater layer, wherein said thermal interface material layer is operable to provide thermal coupling and mechanical compliance with respect to said DUT;

a compression mechanism for providing compression to said VTCM layer to vary a thermal conductance of said VTCM layer;

a computer system for implementing a method of testing said DUT, said method comprising;

applying input test signals to DUT; and retrieving output signals from said DUT responsive to said input test signals.

20. An apparatus as described in claim 19 wherein said thermal interface material layer further comprises an integrated temperature sensor; and the method further comprises varying a temperature of said DUT by varying said electronic control to said heater layer and further by varying an amount of compression applied to said VTCM layer from said compression mechanism, both responsive to said integrated temperature sensor.

* * * * *